United States Patent [19]
Yoshikawa et al.

[11] Patent Number: 6,125,041
[45] Date of Patent: *Sep. 26, 2000

[54] CARD-TYPE ELECTRONIC DEVICE

[75] Inventors: Takamasa Yoshikawa; Noriaki Shiba; Atsuko Yamaguchi, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/931,490

[22] Filed: Sep. 16, 1997

[30] Foreign Application Priority Data

Mar. 7, 1997 [JP] Japan .................................. 9-053539

[51] Int. Cl.$^7$ .................................................. H05K 1/14
[52] U.S. Cl. .......................... 361/737; 361/752; 361/760; 361/808; 235/492; 257/679
[58] Field of Search ................................ 361/737, 752, 361/740, 741, 742, 736, 748–750, 760, 807–809; 206/706; 211/41.17

[56] References Cited

U.S. PATENT DOCUMENTS

| | | | |
|---|---|---|---|
| 5,481,434 | 1/1996 | Banakis et al. ............................ | 361/756 |
| 5,521,793 | 5/1996 | Dalgleish et al. ......................... | 361/752 |
| 5,563,770 | 10/1996 | Bethurum .................................. | 361/737 |
| 5,574,628 | 11/1996 | Persia et al. .............................. | 361/737 |
| 5,586,010 | 12/1996 | Murtuza et al. .......................... | 361/751 |
| 5,754,404 | 5/1998 | Biermann et al. ......................... | 361/737 |
| 5,838,546 | 11/1998 | Miyoshi .................................... | 361/749 |
| 5,848,462 | 12/1998 | Sera et al. ............................. | 361/750 X |

FOREIGN PATENT DOCUMENTS 3-29389  7/1991  Japan .

Primary Examiner—Jayprakash N. Gandhi
Attorney, Agent, or Firm—Armstrong, Westerman, Hattori, McLeland & Naughton

[57] ABSTRACT

A card-type electronic device including at least a circuit board, wherein the circuit board includes a part mounting portion partially surrounded by a cutout portion and mechanically and electrically connected to other portion of the circuit board via a flexible supporting portion. The flexible supporting portion is bent so that a height position of the part mounting portion is different from a height position of a remaining portion of the circuit board.

10 Claims, 11 Drawing Sheets

CARD-TYPE ELECTRONIC DEVICE

BACKGROUND OF THE INVENTION

1. Field of the Invention

The present invention generally relates to card-type electronic devices, and particularly, to a card-type electronic device in which a circuit board for mounting parts such as an IC is provided.

A PC card is conventionally known as one type of card device. Recently, multi-function and increased function of PC cards as well as various parts mounted thereon have been achieved. Accordingly, the shape (width, height) of the parts mounted on the PC card has been varied, and, hence, there are demands for a mounting structure by which these parts can be efficiently accommodated in a PC card.

For this reason, when designing a structure of a card which mounts parts having various heights, a frame having an offset suitable for a height of a particular part is selected, taking into account a positional relationship between a center of the shape of a PC card and a center of a circuit board, combined with a suitable connector.

On the other hand, due to the various shapes of the mounting parts available these days, there are cases where the parts are mounted on both sides of a circuit board or a part having an increased height is mounted on a board. In such cases, it is necessary to change the board position (offset) in the PC card due to a height restriction of a mounting part.

In order to make such changes, it is necessary to produce or purchase a suitable frame and this increases the number of production lines and cost necessary for the frames. Also, extra time may be required for the development or production of PC cards.

Accordingly, it is necessary to reduce the cost of PC cards by decreasing the number of construction parts. This may be achieved by using a fewer number of frames without producing or purchasing new frames. Also, it is necessary to provide a PC card with a frame having a suitable offset structure so that a multi-function device may be mounted.

2. Description of the Related Art

FIGS. 1 through 5 are diagrams showing a conventional card-type electronic device. In FIGS. 1 through 5, a PC card is shown as an example of the card-type electronic device. FIG. 1 is a diagram showing an exploded view of a conventional PC card 1. FIG. 2 is a diagram showing a perspective view of the PC card 1.

As shown in FIGS. 1 and 2, the PC card 1 is comprised of an IC module 2, a frame 3, and a pair of metal panels 4 and 5. The IC module 2 has a structure in which a connector 6, a mounting part (an IC) 8, etc., are mounted,. using solder, on a printed wiring board (circuit board) 7. In the IC module 2, IC terminals of the IC 8 are electrically connected with connector terminals 10 of a connector 6 by being soft soldered onto the printed wiring board 7.

The frame 3 is generally formed of a plastic resin and includes a positioning portion 11 at the inner periphery thereof. The height position of the IC module 2 in the PC card 1 is determined when the printed wiring board 7 is engaged with the positioning portion 11 and the printed wiring board 7 is supported by the positioning portion 11.

The metal panels 4 and 5 may be formed of, for instance, SUS and are provided so as to sandwich the IC module 2.

In order to assemble the PC card 1 having the above structure, the pair of metal panels 4 and 5 are adhered to the frame 3 so as to sandwich the IC module 2 after the IC module 2 is located at the positioning portion 11 which is formed with the frame 3.

FIG. 3 is a diagram showing a structure of the conventional frame 3 in detail.

As mentioned above, the positioning portion 11 of the frame 3 supports the printed wiring board 7 and determines the height position (board offset) thereof. Also, the metal plates 4 and 5 are fixed to an upper surface 12 and a lower surface 13, respectively, of the frame 3. When the metal plates 4 and 5 are adhered to the frame 3, the mounting part (the IC) 8 is sealed therein by a mechanical engagement. Moreover, connector engaging portions 14 are provided with the frame 3, which support the connector 6 by being engaged with a corresponding convex portion 15 formed on the right-hand and left-hand sides of the connector 6, respectively.

In the positioning structure of the conventional printed wiring board 7, the positioning portion 11 for mounting the printed wiring board 7 is formed with the frame 3 and the printed wiring board 7 is mounted on the positioning portion 11. The offset position (i.e., the height position) of the printed wiring board 7 is determined by taking into account a productivity during construction, automation of the construction, and stabilization of mechanical strength of a product.

However, the position of the positioning portion 11 is conventionally formed at a single height of the frame 3. Therefore, if the offset position of the printed wiring board 7 is once determined, the height of the mounting part 8 which can be employed is automatically determined and use of a mounting part whose height is not within the allowable range is restricted.

In order to avoid the above problem, it may be possible not to use a positioning structure, or to change the shape of the metal plates 4 and 5 as shown in FIGS. 4 and 5.

However, if the positioning structure is not used, the printed wiring board 7 cannot be fixed and the productivity during construction may be decreased and the mechanical strength of the product may be lowered. Also, the shape of the metal plates 4 and 5 cannot be changed for a card-type electronic device such as a PC card whose size is already determined.

Accordingly, when a mounting part 8 which has a height greater than the allowable range is mounted using the frame 3, it is necessary to change the offset position, and in order to change the offset position, it is necessary to produce or purchase a new frame 3 which has an offset position altered accordingly.

Also, since the offset position is determined by the positioning portion 11 of the frame 3, selection of parts is restricted and a mounting part 8 having a height that is a little higher than the allowable range cannot be mounted. Likewise, when a mounting part 8 having a height that is lower than the allowable range is used, dead space is generated in the PC card and qualities thereof such as mechanical strength is reduced.

In order to avoid the above problems, it is necessary to produce a frame 3 having an offset position at a different portion. That is, one frame is necessary for one offset portion.

SUMMARY OF THE INVENTION

Accordingly, it is a general object of this invention to provide a card-type electronic device in which the above-mentioned problems are eliminated.

A more specific object of the present invention is to provide a card-type electronic device in which selection of mounting parts and board wiring patterns may be increased without increasing frame variations. That is, it is not necessary to produce a new frame having a different positioning portion which corresponds to certain mounting parts.

It is another object of the present invention to provide a card-type electronic device which may be produced without increasing cost and a manufacturing process for producing the electronic device.

The objects described above are achieved by a card-type electronic device comprising at least a circuit board and a frame which supports the circuit board, wherein the frame includes at least a first positioning portion and a second positioning portion for the circuit board, the first positioning portion being formed at a first height from a bottom of the frame and the second positioning portion being formed at a second height from the bottom of the frame, and the circuit board includes at least one positioning groove which is selectively engaged with one of the first positioning portion and the second positioning portion so that the circuit board is supported by the frame.

According to the above card-type electronic device, the height of the first positioning portion is different from the height of the second positioning portion (and a third positioning portion, . . . , etc.) and the positioning portion of the circuit board is selectively engaged with one of the first positioning portion, the second positioning portion, etc. Therefore, the circuit board can be selectively supported by the frame at a certain height position (an offset position) among a plurality of available height positions.

Thus, it becomes possible to select an appropriate height position for a circuit board in accordance with a height of a mounting part(s). Hence, it is not necessary to produce a new frame in accordance with the height of the mounting part(s). Also, selection of mounting parts is increased and the quality of the card-type electronic device may be constantly maintained.

The objects described above are also achieved by the card-type electronic device, further comprising: a connector provided with the circuit board; and an engaging mechanism for engaging the frame with the connector, wherein the engaging mechanism enables the frame to engage with the connector independent of the height position of the circuit board.

According to the above card-type electronic device, since the engaging mechanism enables the frame to engage with the connector regardless of the height position of the circuit board, it is not necessary to change the structure of the frame in accordance with the structure of the connector.

The objects described above are achieved by a card-type electronic device comprising at least a circuit board, wherein the circuit board includes a part mounting portion partially surrounded by a cutout portion and mechanically and electrically connected to another portion of the circuit board via a flexible supporting portion, and the flexible supporting portion is bent so that a height position of the part mounting portion is different from a height position of a remaining portion of the circuit board.

According to the above card-type electronic device, since the flexible supporting portion is bent so that the height position of the part mounting portion becomes different from the height position of the rest of the circuit board, it becomes possible to mount taller parts on the part mounting portion and shorter parts on the rest on the circuit board so that space inside the electronic device may be used efficiently.

As mentioned above, since height of a part (i.e., the mounting portion) of a circuit board may be varied, it is possible to mount taller parts together with shorter parts on the same circuit board at the same time. Thus, there is no need to produce a new frame so that it corresponds to the height of mounting parts. Also, selection of mounting parts is increased and the quality of the card-type electronic device may be constantly maintained.

The objects described above are also achieved by the card-type electronic device, wherein the circuit board is comprised of a multilayer wiring board, and a number of layers of the flexible supporting portion is less than a number of layers of the multilayer wiring board.

According to the above card-type electronic device, the flexible supporting portion is made flexible as the circuit board is comprised of a multilayer wiring board and the number of layers of the flexible supporting portion is less than the number of layers of the multilayer wiring board. By using this configuration of the flexible supporting portion, the number of construction parts and cost for producing the electronic device may be reduced and the manufacturing process thereof may be simplified.

The objects described above are also achieved by the card-type electronic device, wherein the circuit board is comprised of a composite board made of a glass-epoxy printed board and a polyimide type flexible printed board, and the flexible supporting portion is made only of the polyimide type flexible printed board.

According to the above card-type electronic device, since the circuit board is comprised of a composite board which is made of a glass-epoxy printed board and a polyimide type flexible printed board and the flexible supporting portion is made only of the polyimide type flexible printed board, the position of the flexible supporting portion may be easily changed with respect to the circuit board and, at the same time, the mechanical strength of the circuit board may be maintained.

The objects described above are also achieved by the card-type electronic device, wherein an adhesive resin composition is provided between a part provided on the part mounting portion and a housing of the card-type electronic device.

The objects described above are also achieved by the card-type electronic device, wherein the adhesive resin composition is selected from a group consisting of resins which initially possess flowability and maintain elasticity after curing.

According to the above card-type electronic device, since the adhesive resin composition is provided between a part, which is provided on the part mounting portion, and the housing of the card-type electronic device, it is possible to prevent concentration of stress applied to bonding portions (soldered portions) of a tall mounting part and the housing of the card-type electronic device. Also, vibration of the part mounting portion due to external oscillation may be avoided.

Other objects and further features of the present invention will be apparent from the following detailed description when read in conjunction with the accompanied drawings.

DESCRIPTION OF THE PREFERRED EMBODIMENTS

In the following, a description will be given of embodiments of a card-type electronic device according to the present invention with reference to the accompanied drawings.

FIGS. 6 through 12 are diagrams showing a card-type electronic device 20A according to a first embodiment of the present invention. Although a PC card is used as the card-type electronic device 20A in the following embodiments, the present invention may also be applied to other card-type electronic devices.

Figure 6:
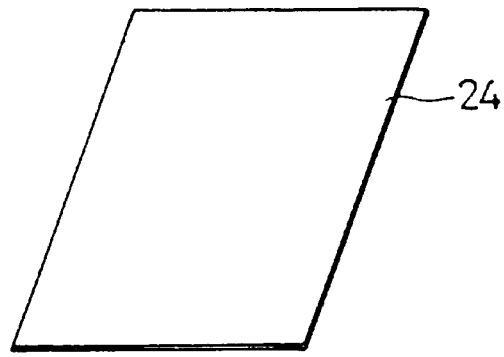
FIG. 6 is a diagram showing an exploded perspective view of a card-type electronic device (in short mounting part mounting state) according to a first embodiment of the present invention.
Figure 6:
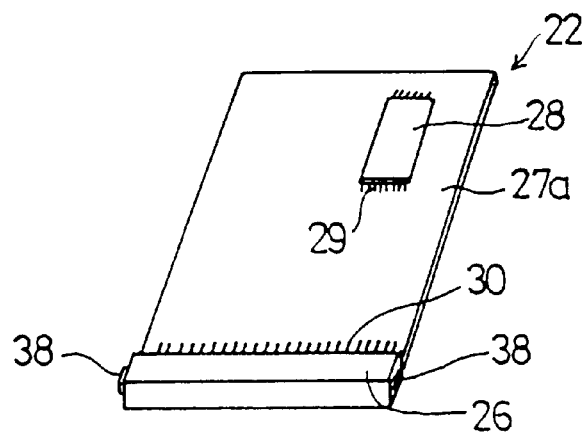
Figure 6:
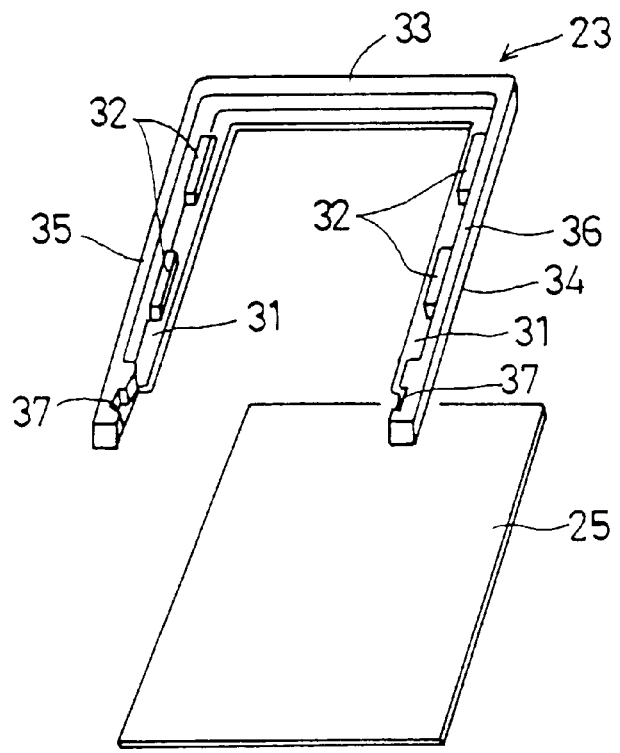

FIG. 6 is a diagram showing an exploded perspective view of the card-type electronic device 20A of the present invention. As shown in FIG. 6, the card-type electronic device 20A (hereinafter referred to as a PC card 20A) is mainly comprised of an IC module 22, a frame 23 and a pair of metal panels 24 and 25.

In the IC module 22, a connector 26, a mounting part 28, etc., are mounted on a printed wiring board (a circuit board) 27a using solder. In the IC module 22, IC terminals 29 of an IC (the mounting part) 28 are electrically connected with connector terminals 30 of a connector 26 by being soft soldered onto the printed wiring board 27a.

The frame 23 is generally formed of a plastic resin and has substantially a U-shape. The frame 23 includes first positioning portions 31 and second positioning portions 32 on the inner periphery thereof. As will be described later, the height position of the IC module 22 in the PC card 20A is determined when the printed wiring boards 27a and 27b are selectively engaged with the first positioning portion 31 or the second positioning portion 32.

Also, since the frame 23 may be made of a plastic resin, it is easy to integrally form the first and the second positioning portions 31 and 32 with the frame 23.

The metal panels 24 and 25 may be formed of, for instance, SUS and are provided on an upper surface 33 and a lower surface 34, respectively, of the frame 23 so as to sandwich the IC module 22.

In order to assemble the PC card 20A having the above structure, the pair of metal panels 24 and 25 are adhered to the upper surface 33 and the lower surface 34, respectively, of the frame 23 so as to sandwich the IC module 22 after the IC module 22 is selectively engaged with the first positioning portion 31 or the second positioning portion 32 of the frame 23.

Figure 7:
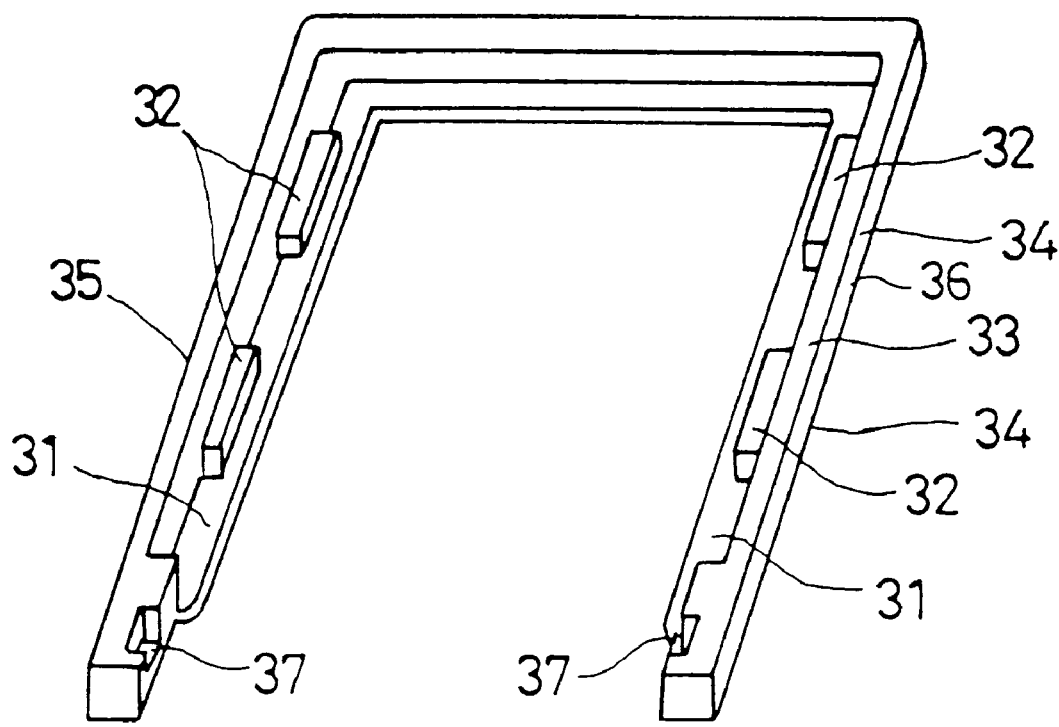
FIG. 7 is a diagram showing a perspective view of a frame used in the first embodiment of the present invention.

Next, the structure of the frame 23 will be explained. FIG. 7 is a diagram showing the frame 23 in a magnified scale.

Figure 1:
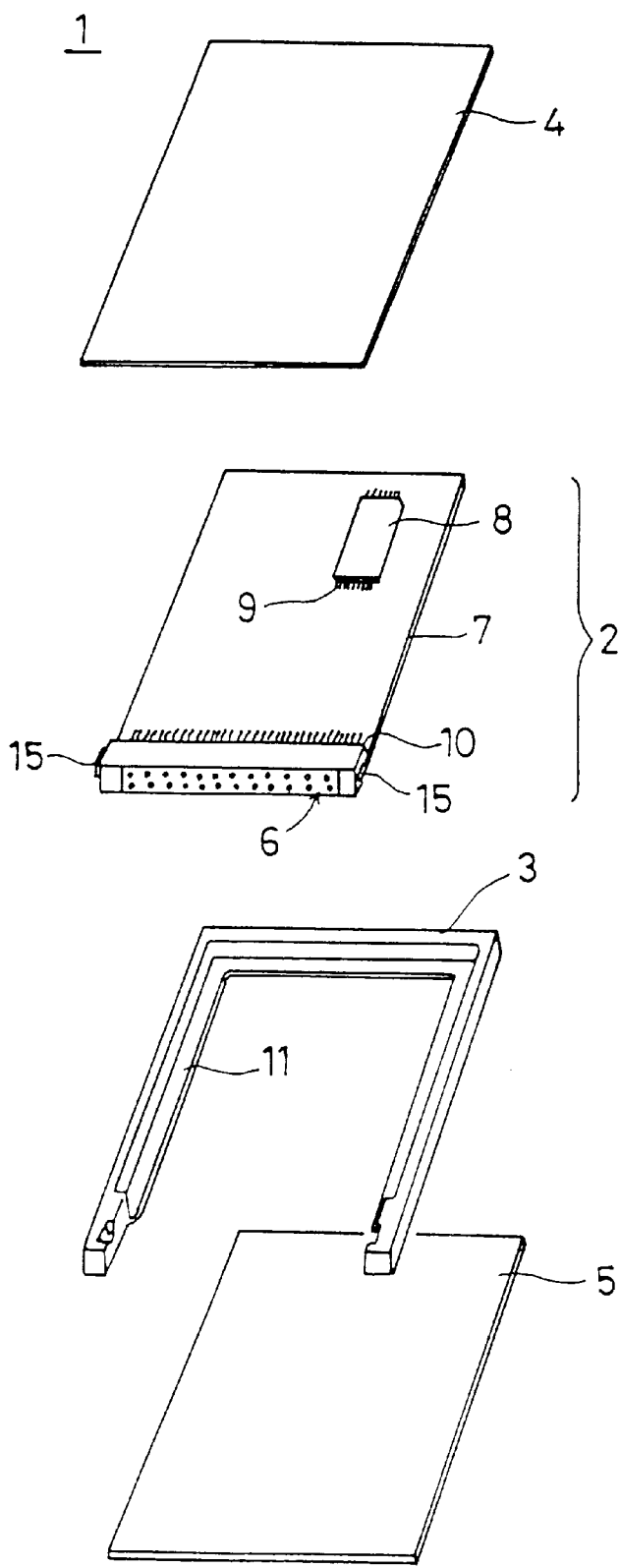
FIG. 1 is a diagram showing an exploded perspective view of a conventional PC card.
Figure 2:
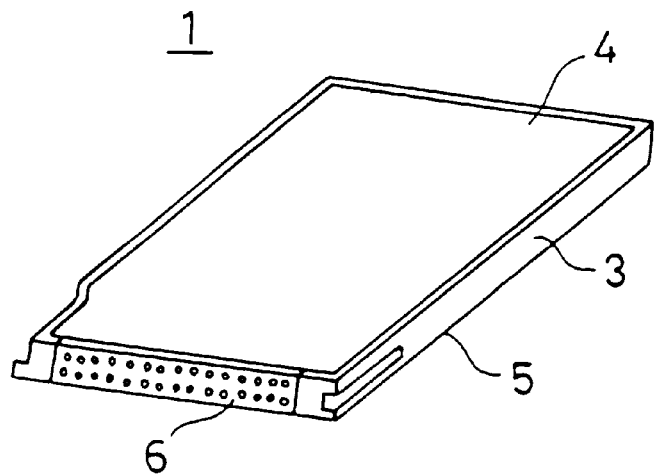
FIG. 2 is a diagram showing a perspective view of the conventional PC card.
Figure 3:
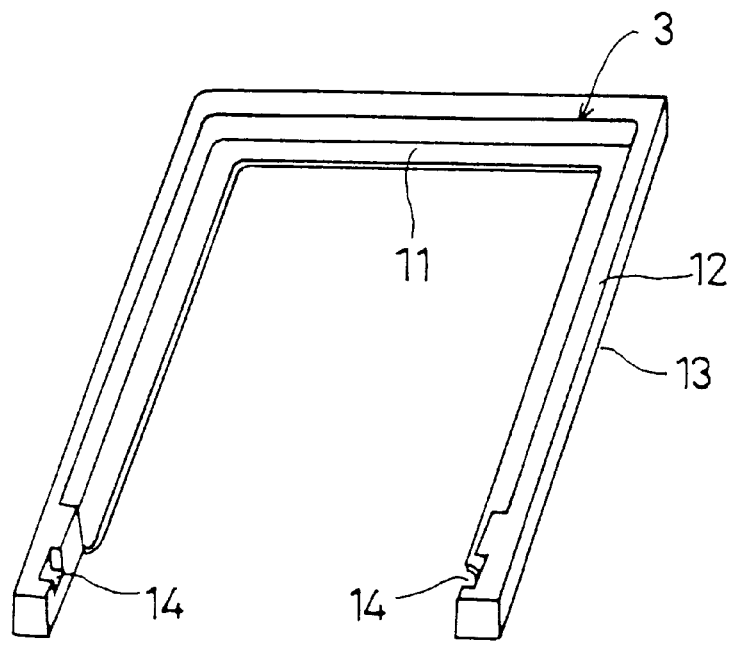
FIG. 3 is a diagram showing a perspective view of a frame of the conventional PC card in a magnified scale.
Figure 4:
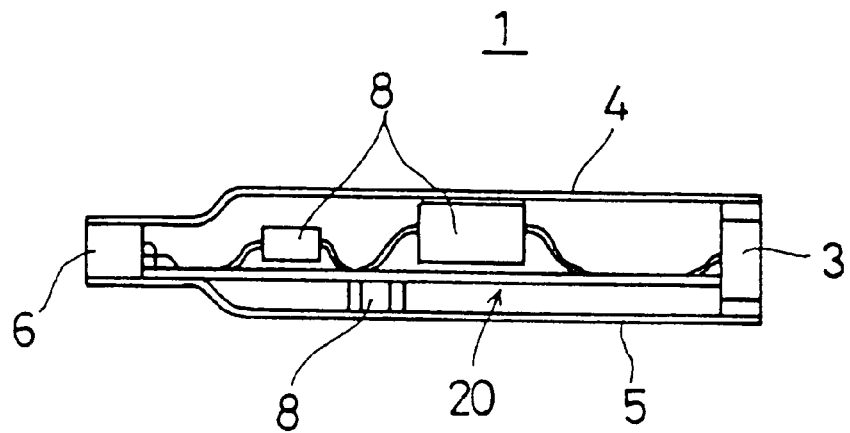
FIG. 4 is a diagram showing a cross sectional view of a conventional PC card.
Figure 5:
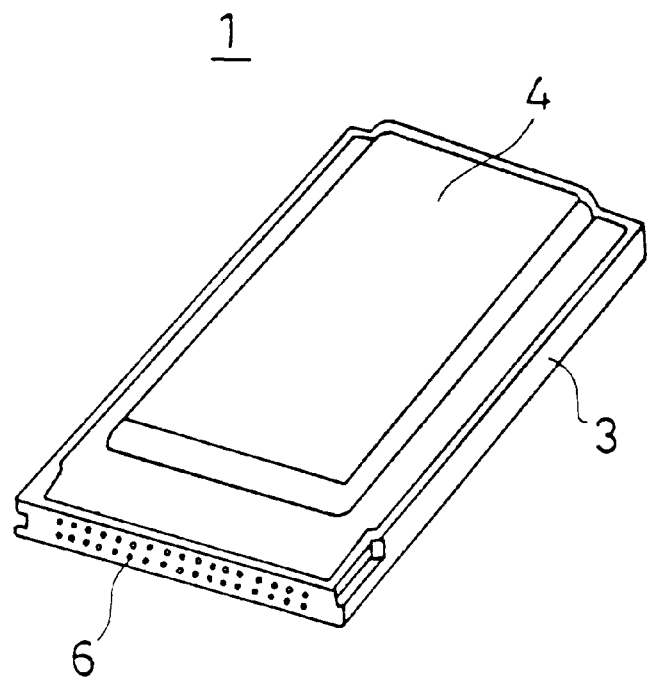
FIG. 5 is a diagram showing a perspective view of another conventional PC card.

As shown in the figure, the structure of the first positioning portion 31 is substantially the same as the conventional positioning portion 11 (refer to FIGS. 1 and 3) and extends towards the inside of the frame 23 from the lower surface 34. Accordingly, the first positioning portion 31 is located at the lower portion of the frame 23. Also, in this embodiment, the first positioning portion 31 is formed along the entire inner periphery of the frame 23.

On the other hand, the second positioning portions 32 are formed at the upper portion (i.e., higher position) of the frame 3 as compared with the first positioning portion 31. Moreover, in this embodiment, two pairs of the second positioning portions 32 are provided inside of the sides 35 and 36 of the frame 23 so as to oppose each other as shown in the figure. That is, space is provided between the adjacent second positioning portions 32.

Also, the metal plates 24 and 25 are fixed to the upper surface 33 and the lower surface 34, respectively, of the frame 23. When the metal plates 24 and 25 are adhered to the frame 23, the mounting part (the IC) 28 is sealed therein by a mechanical engagement. Moreover, connector engaging portions 37 are provided with the frame 23, which support the connector 26 by being engaged with a corresponding convex portion 38 (refer to FIG. 6) formed on the right and left-hand sides of the connector 26, respectively.

In FIG. 6, the printed wiring board 27a has substantially a flat rectangular shape and no grooves are formed on the outer periphery thereof. Thus, when the printed wiring board 27a is located in the frame 23, portions of the outer periphery of the printed wiring board 27a is engaged with the corresponding second positioning portions 32 and supported by the second corresponding portions 32.

Figure 9:
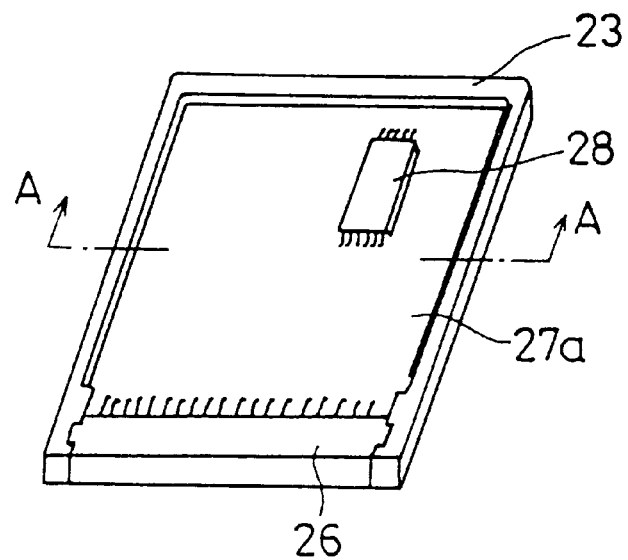
FIG. 9 is a diagram showing a perspective view of the card-type electronic device (in the short mounting part mounting state) of which a metal plate is removed.
Figure 11:
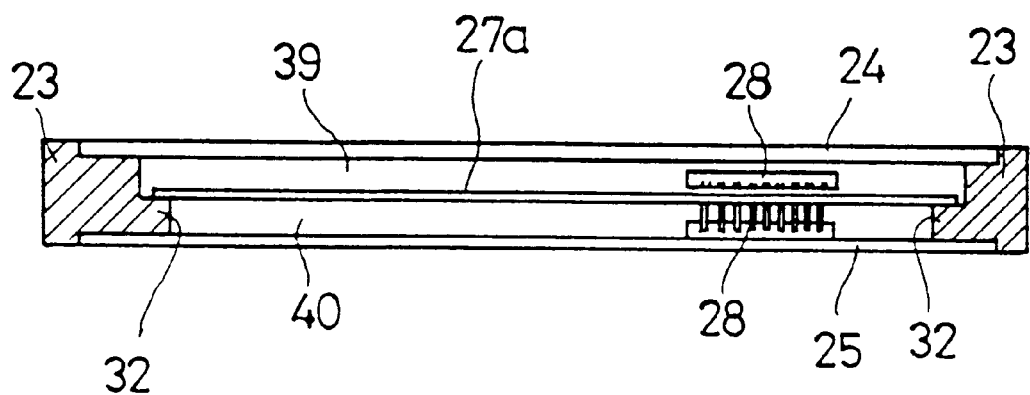
FIG. 11 is a diagram showing a cross-section of the card-type electronic device cut along the A—A line indicated in FIG. 9.

FIG. 9 is a diagram showing a state of the PC card in which the printed wiring board 27a is positioned in the frame 23 and the metal plate is removed. FIG. 11 is a diagram showing a cross-section of the combined frame 23 and the printed wiring board 27a cut along the line A—A indicated in FIG. 9.

As shown in FIGS. 9 and 11, the printed wiring board 27a is supported by the second positioning portions 32 of the frame 23. Since the second positioning portions 32 are formed at a position higher than the first positioning portion 31, the offset position of the printed wiring board 27a is also at a high position (substantially half of the thickness of the frame 23 in this embodiment).

Accordingly, as shown in FIG. 11, space of relatively small height (hereinafter referred to as short space portions 39 and 40) are generated above and below the printed wiring board 27a, respectively. Thus, if the height of the mounting part 28 suitably corresponds to the short space portions 39 and 40, no dead space is generated and an effective mounting can be realized with the PC card 20A using the printed wiring board 27a.

Next, a printed wiring board 27b shown in FIG. 8 will be explained.

Figure 8:
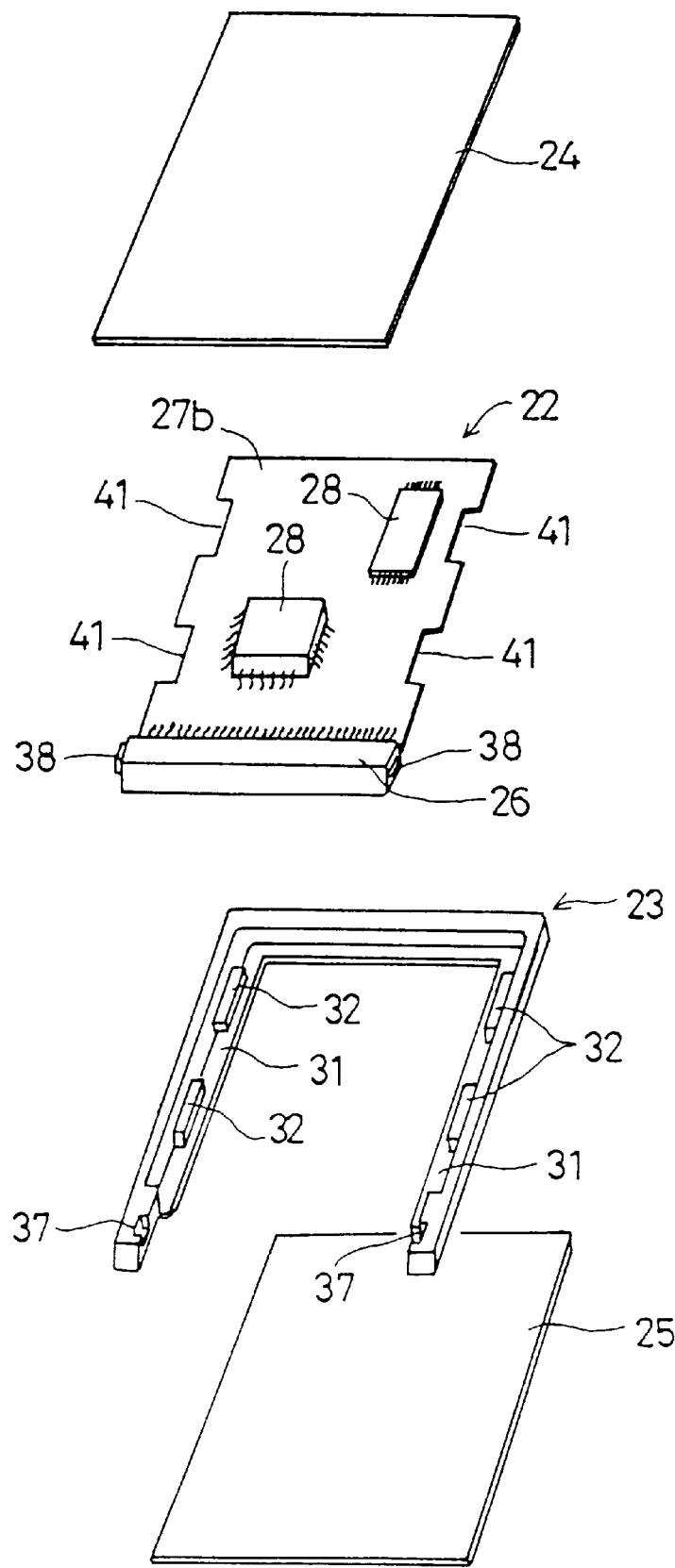
FIG. 8 is a diagram showing an exploded perspective view of a card-type electronic device (in tall mounting part mounting state) according to the first embodiment of the present invention.

As shown in FIG. 8, positioning grooves 41 are formed around the outer periphery of the printed wiring board 27b. The position and the size of each of the positioning grooves 41 corresponds to the respective second positioning portion 32.

Practically, each of the positioning grooves 41 is formed at a position opposed to the respective second positioning portion 32. Also, the size of each of the positioning grooves 41 is determined so as to be a little larger than the corresponding second positioning portion 32.

Therefore, when the printed wiring board 27b is combined with the frame 23, the printed wiring board 27b is not engaged with the second positioning portions 32 and is supported by the first positioning portion 31.

Figure 10:
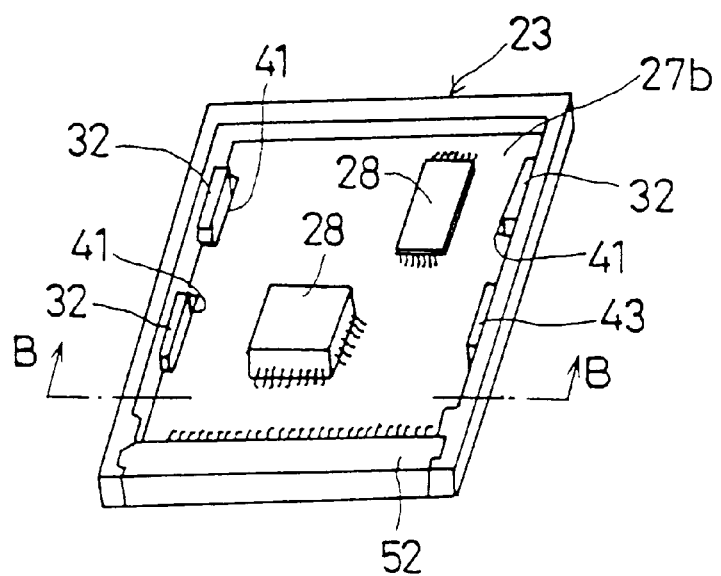
FIG. 10 is a diagram showing a perspective view of the card-type electronic device (in the tall mounting part mounting state) of which a metal plate is removed.
Figure 12:
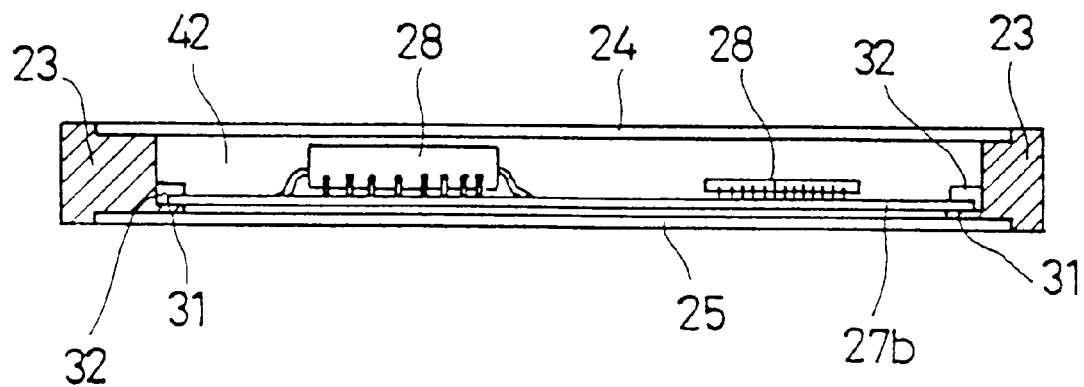
FIG. 12 is a diagram showing a cross-section of the card-type electronic device cut along the B—B line indicated in FIG. 10.

FIG. 10 is a diagram showing a state in which the printed wiring board 27b is positioned in the frame 23. FIG. 12 is a diagram showing a cross-section of the combined frame 23 and the printed wiring board 27b cut along the line B—B indicated in FIG. 10.

As shown in FIGS. 10 and 12, the printed wiring board 27b is supported by the first positioning portion 31 of the frame 23. Since the first positioning portion 31 is formed at a position lower than the second positioning portions 32, the offset position of the printed wiring board 27b is also low (substantially the bottom surface position of the frame 23 in this embodiment).

Accordingly, as shown in FIG. 12, a space of relatively high height (hereinafter referred to as high height space portion 42) is generated above the printed wiring board 27b. Thus, even if the height of the mounting part 28 is relatively high, it is possible to securely located the mounting part 28 in the PC card 20A using the printed wiring board 27b.

As mentioned above, according to the present invention, the height position (offset position) of the printed wiring boards 27a and 27b, respectively, is made different by selectively engaging the boards with the first positioning portion 31 or the second positioning portions 32. This is possible because the plurality of positioning portions (31 and 32) for supporting the circuit board are formed with the frame 23 with a different height and the positioning grooves 41 are selectively formed with the printed wiring board 27a or 27b.

Thus, it becomes possible to select the height position of the printed wiring boards 27a and 27b using the single frame 23. Accordingly, it is not necessary to produce another frame which corresponds to the height of the mounting part 28, and hence selectivity in the use of mounting parts may be improved and a high quality of the PC card 20A may be constantly maintained.

Also, according to this embodiment of the present invention, the (offset) position of the printed wiring boards 27a and 27b are different when these boards 27a and 27b are positioned in the frame 23. Thus, the position of the connector 26 which is provided with the printed wiring boards 27a and 27b is also different.

For the above reason, the connector engaging portions 37 are formed with the frame 23 as an engaging mechanism for connecting the frame 23 with the connector 26. The convex portions 38 to be engaged with the corresponding connector engaging portion 37 are provided with the connector 26. Also, since each of the connector engaging portions 37 has a groove structure extending in the up-and-down (vertical) directions, it is possible to securely engage the connector 26 with the frame 23 regardless of the position of the connector 26 which is dependent on the position of the printed wiring boards 27a or 27b on which the connector 26 is mounted.

Figure 13:
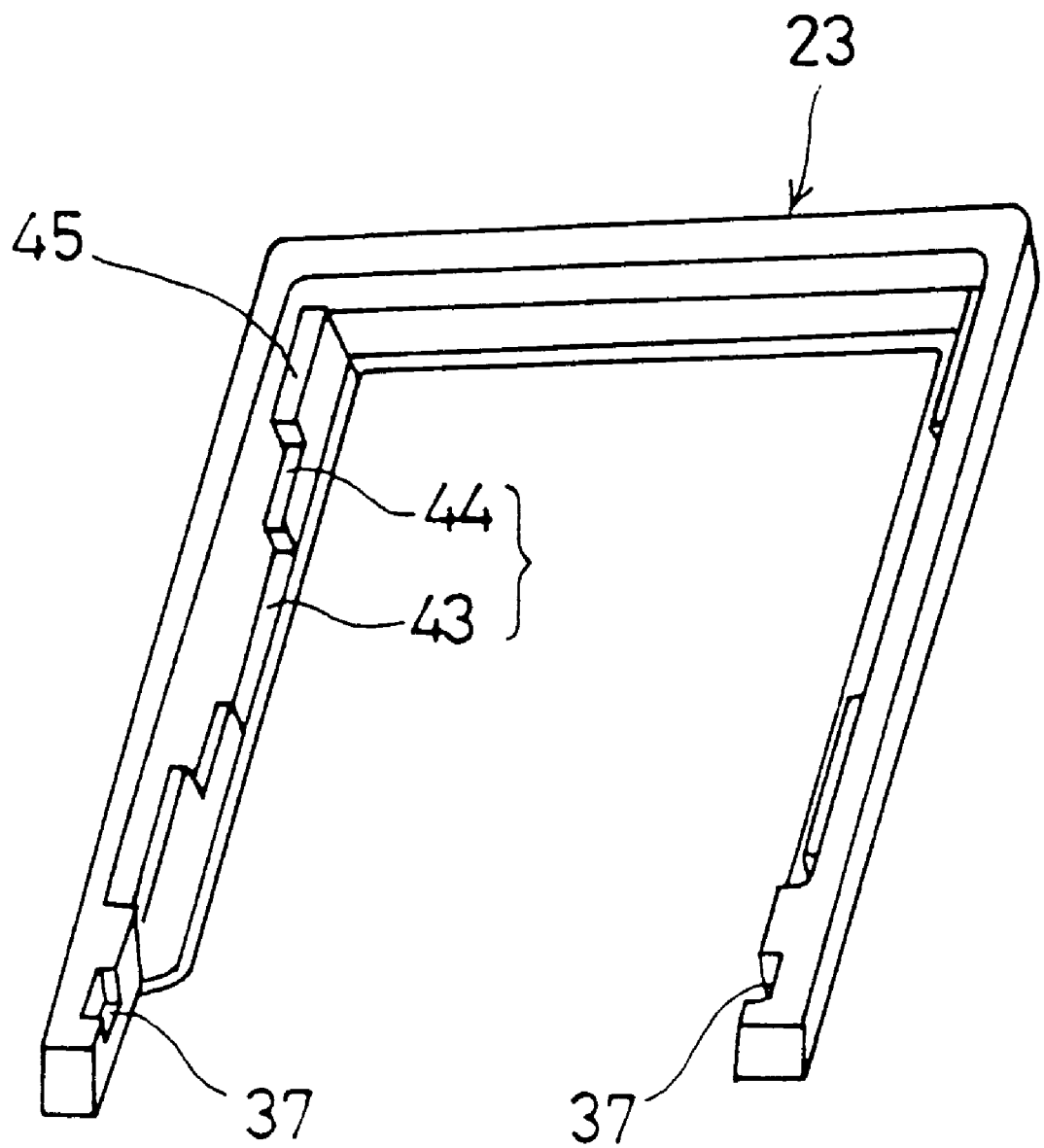
FIG. 13 is a diagram showing a perspective view of a frame used in a modified example of the first embodiment of the present invention.

Note that although the printed wiring boards 27a and 27b are supported at two different heights in the above embodiment, the number of supporting position of a board is not limited to two and it is possible to form three positioning portions 43 to 45 as shown in FIG. 13 so that a printed wiring board may be supported at three different heights. Moreover, it is possible to form more than three positioning portions with a frame.

Next, a second embodiment according to the present invention will be explained.

Figure 14:
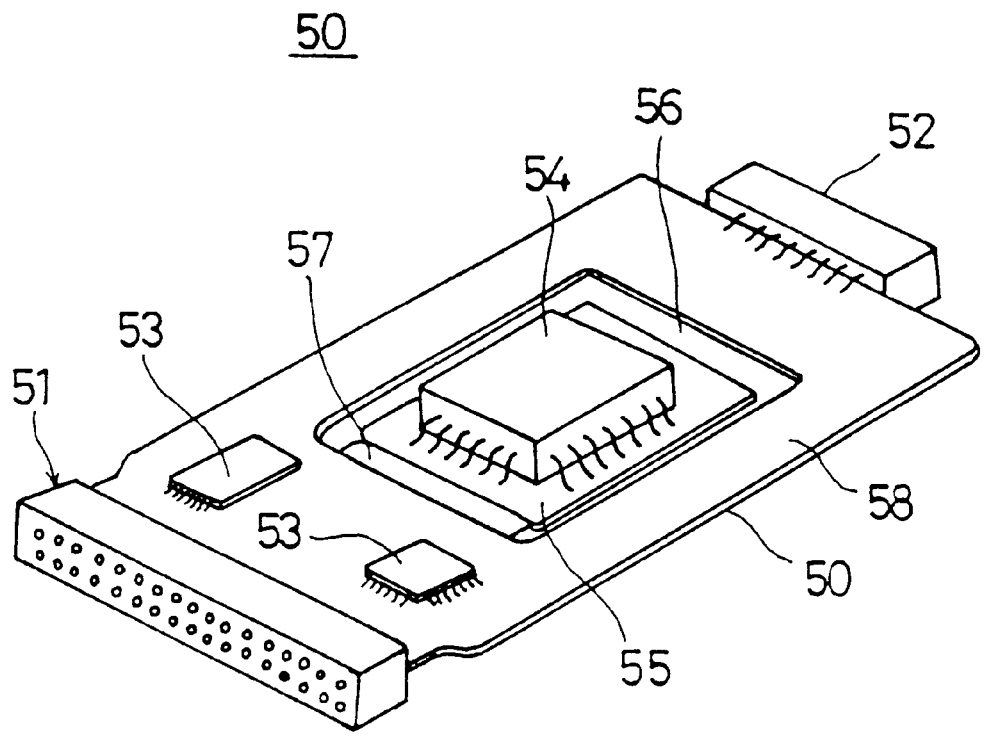
FIG. 14 is a diagram showing a circuit board used for a card-type electronic device according to a second embodiment of the present invention.
Figure 15:
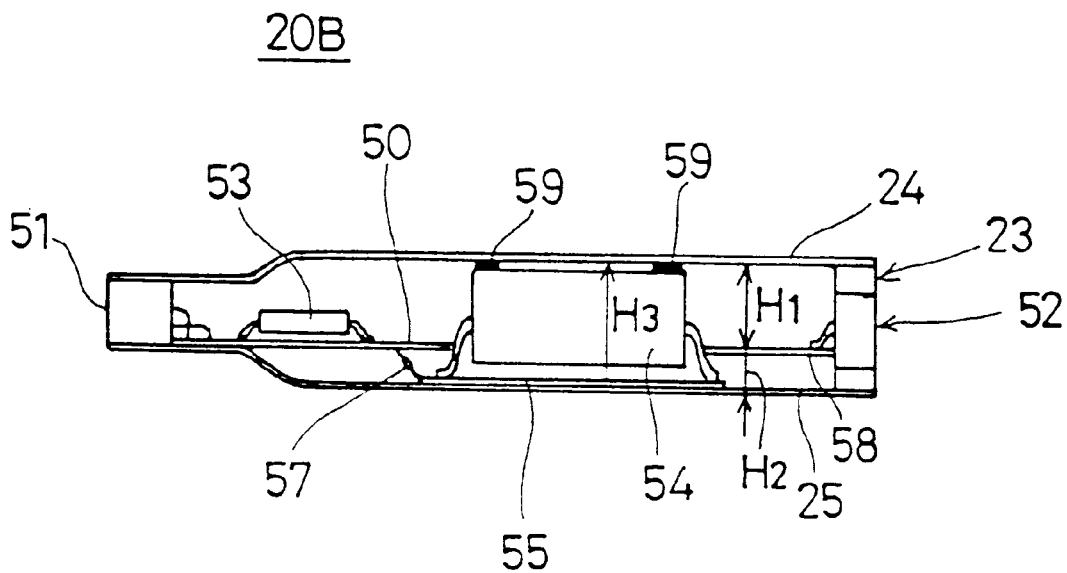
FIG. 15 is a diagram showing a cross-section of the card-type electronic device according to the second embodiment of the present invention.

FIGS. 14 and 15 are diagrams showing a PC card 20B according to the second embodiment of the present invention. FIG. 14 is a diagram showing a printed wiring board 50 provided with the PC card 20B in a magnified scale. FIG. 15 is a diagram showing a cross-sectional view of the PC card 20B. Note that elements which are the same as the ones in the above-mentioned PC card 20A of the first embodiment are indicated by the same reference numerals and the explanation thereof will be omitted.

First, a structure of the printed wiring board 50 will be explained with reference to FIG. 14. The printed wiring board 50 is a multilayer flexible printed board which is comprised of a connector 51 for a PC card interface, a connector 52 for communication, a mounting part 53 of relatively small height (hereinafter referred to as a short mounting part 53), a mounting part 54 of relatively large height (hereinafter referred to as a tall mounting part 54) and a part mounting portion 55.

The part mounting portion 55 has a rectangular shape and a cutout portion 56 is formed so as to partially surround the part mounting portion 55. The part mounting portion 55 is supported by a flexible supporting portion 57 and mechanically and electrically connected to the printed wiring board 50. In the following, a portion of the printed wiring board 50 excluding the part mounting portion 55 and the flexible supporting portion 57 is referred to as a peripheral plate portion 58.

In this embodiment, the printed wiring board 50 has four-layers whereas the number of layers of the flexible supporting portion 57 is two. Therefore, it is easy to deform the flexible supporting portion 57 as compared with the other parts of the printed wiring board 50. Since the flexible supporting portion 57 can be easily deformed, the part mounting portion 55 may be moved in the lower direction (and also the upper direction) with respect to the peripheral plate portion 58.

Also, the short mounting parts 53 are located on the peripheral plate portion 58 whereas the tall mounting part 54 is located on the part mounting portion 55.

Next, the structure of the PC card 20B including the printed wiring board 50 having the above-mentioned structure will be explained with reference to FIG. 15.

The printed wiring board 50 is held in the PC card 20B by being supported by the frame 23. In this state, a space having a height H1 in the figure is generated between the peripheral plate portion 58 and the upper metal panel 24. Also, a space having a height H2 in the figure is generated between the peripheral plate portion 58 and the lower metal panel 25.

In this embodiment, the part mounting portion 55 may be shifted in the lower direction by deforming the flexible supporting portion 57. In this configuration, a space having a height H3 in the figure is generated between the part mounting portion 55 and the metal plate 24. The height order of H1, H2 and H3 is H3>H1, H3>H2 and a space having a large height is generated above the part mounting portion 55.

As mentioned above, by shifting the part mounting portion 55 with respect to the peripheral plate portion 58, the height of the part mounting portion 55 and the height of the peripheral plate portion 58 may be different. Thus, by locating the short mounting parts 53 on the peripheral plate portion 58 and the tall mounting part 54 on the part mounting portion 55, it becomes possible to efficiently mount the short mounting parts 53 and the tall mounting part 54 in the PC card 20b in which space for locating such parts is limited.

Accordingly, it is not necessary to produce or purchase a special frame 23 in order to mount the mounting parts having different heights. Hence, the selectivity of the mounting parts is increased and the high quality of a card-type electronic device may be maintained.

Also, in this embodiment, as mentioned above, a multilayer printed wiring board 50 is used and the number of layers of the flexible supporting portion 57 is less than that of the other parts of the board 50. Thus, the flexible supporting portion 57 may be easily deformed as compared with the other parts of the board 50. Accordingly, the number of parts required and cost necessary for producing a device may be reduced and the manufacturing process may be simplified as compared with a configuration of a device in which the flexible supporting portion is used as a separate part.

On the other hand, because the position of the part mounting portion 55 may be moved with respect to the peripheral plate portion 58, the part mounting portion 55 may be vibrated due to external oscillation. However, in this embodiment, adhesive resin 59 is provided between the tall mounting part 54 and the upper metal panel 24 as shown in the figure so that the part mounting portion 55 may not be vibrated.

The adhering resin 59 may be a rigid type resin, however, it is preferable that the resin initially possesses flowability and maintains elasticity after curing. Typical examples of such resin include a silicone type resin. By providing the adhesive resin 59 between the tall mounting part 54 and the upper metal panel 24, it is possible to prevent the concentration of stress applied to bonding portions (soldered portions) of the tall mounting part 54 and the part mounting portion 55.

Figure 16:
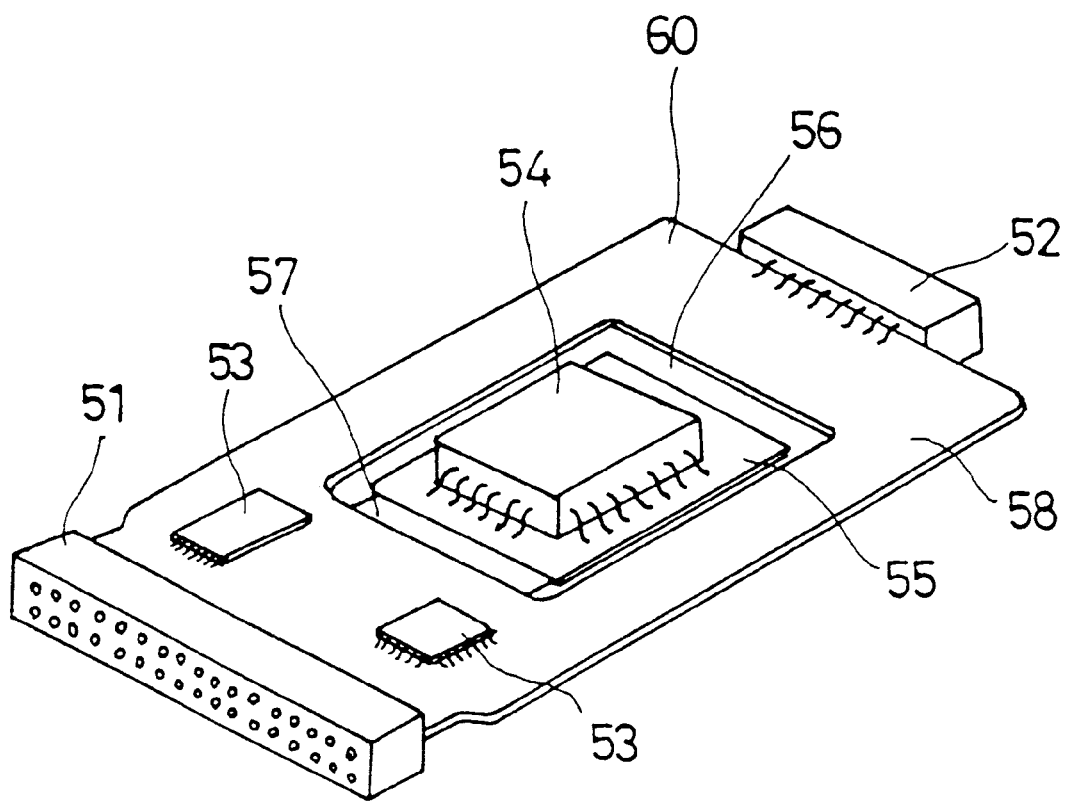
FIG. 16 is a diagram showing a modified example of the circuit board used for the card-type electronic device according to the second embodiment of the present invention.

FIG. 16 is a diagram showing a modified example of the second embodiment according to the present invention. In this embodiment, a composite board 60 made of a glass-epoxy printed board and a polyimide type flexible printed board is used as a circuit board. A flexible supporting portion 57 connecting a part mounting portion 55 with a peripheral plate portion 58 is formed of only the polyimide type flexible print board.

By using the above configuration, it is possible to maintain the mechanical strength of portions other than the flexible supporting portion 57. Also, the position of the flexible supporting portion 57 may be easily shifted with respect to a peripheral plate portion 58.

The present invention is not limited to the above-mentioned embodiments, and variations and modifications may be made without departing from the scope of the present invention.

What is claimed is:

1. A card-type electronic device comprising at least a circuit board,
    wherein said circuit board includes a part mounting portion partially surrounded by a cutout portion and mechanically and electrically connected to other portion of said circuit board via a flexible supporting portion,
    wherein the part mounting portion has a plate shape on which a component can be mounted, and
    said flexible supporting portion is bent so that a height position of said part mounting portion is different from a height position of a remaining portion of said circuit board.

2. The card-type electronic device as claimed in claim 1, wherein said circuit board is comprised of a multilayer wiring board, and
    a number of layers of said flexible supporting portion is less than a number of layers of said multilayer wiring board.

3. The card-type electronic device as claimed in claim 1, wherein said circuit board is comprised of a composite board made of a glass-epoxy printed board and a polyimide type flexible printed board, and
    said flexible supporting portion is made only of said polyimide type flexible printed board.

4. The card-type electronic device as claimed in claim 1, wherein an adhesive resin composition is provided between a part provided on said part mounting portion and a housing of said card-type electronic device.

5. The card-type electronic device as claimed in claim 4, wherein said adhesive resin composition is selected from a group consisting of resins which initially possess flowability and maintain elasticity after curing.

6. The card-type electronic device as claimed in claim 1, further comprising an electronic component mounted on an entire surface of the part mounting portion of the circuit board.

7. The card-type electronic device as claimed in claim 1, further comprising an electronic component mounted on the part mounting portion so that the electronic component protrudes from the remaining portion of the circuit board via the cutout portion.

8. The card-type electronic device as claimed in claim 1, further comprising a first electronic component mounted on the part mounting portion of the circuit board, and a second electronic component mounted on the remaining portion thereof, the first electronic component has a height larger than that of the second electronic component.

9. The card-type electronic device as claimed in claim 1, further comprising:
    an electronic component mounted on the part mounting portion of the circuit board; and
    a plate-shaped cover which covers the circuit board and contacts a surface of the electronic component.

10. The card-type electronic device as claimed in claim 1, further comprising:
    an electronic component mounted on the part mounting portion of the circuit board;
    a first plate-shaped cover which covers a first side of the circuit board and contacts a surface of the electronic components; and
    a second plate-shaped cover which covers a second side of the circuit board opposite to the first side thereof and contacts the part mounting portion.

* * * * *